United States Patent
Kunimoto

(10) Patent No.: US 9,736,941 B1
(45) Date of Patent: Aug. 15, 2017

(54) WIRING SUBSTRATE

(71) Applicant: SHINKO ELECTRIC INDUSTRIES CO., LTD., Nagano (JP)

(72) Inventor: Yuji Kunimoto, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 0 days.

(21) Appl. No.: 15/455,560

(22) Filed: Mar. 10, 2017

(30) Foreign Application Priority Data

Apr. 14, 2016 (JP) .................. 2016-081125

(51) Int. Cl.
 *H05K 1/11* (2006.01)
 *H05K 1/05* (2006.01)

(52) U.S. Cl.
 CPC .......... *H05K 1/116* (2013.01); *H05K 1/05* (2013.01); *H05K 2201/032* (2013.01); *H05K 2201/041* (2013.01)

(58) Field of Classification Search
 CPC ........ H05K 1/112; H05K 1/113; H05K 1/114; H05K 1/115; H05K 1/116
 See application file for complete search history.

(56) References Cited

U.S. PATENT DOCUMENTS 7,394,027 B2 7/2008 Kaluzni et al.
9,000,302 B2 4/2015 Shimizu et al.

FOREIGN PATENT DOCUMENTS

| JP | 2008-524845 | 7/2008 |
| JP | 2013-048197 | 3/2013 |
| JP | 2013-122962 | 6/2013 |
| JP | 2014-225632 | 12/2014 |

*Primary Examiner* — Jeremy C Norris
(74) *Attorney, Agent, or Firm* — IPUSA, PLLC

(57) ABSTRACT

A wiring substrate includes an insulating layer, a stack including wiring layers and photosensitive-resin insulating layers on a first surface of the insulating layer, a wiring layer on a second surface of the insulating layer, having a lower wiring density than the wiring layers, a metal core plate buried in the insulating layer and positioned on the stack side with respect to the center of the insulating layer in its thickness direction, and a via wiring buried in the insulating layer to have a first end face exposed at the first surface and joined to the lowermost one of the wiring layers, and a second end face joined to the metal core plate. The first surface and the first end face are substantially flush with each other. The wiring layers include a signal line, and a ground line concentrically formed around the signal line, with a predetermined interval therebetween.

9 Claims, 8 Drawing Sheets

WIRING SUBSTRATE

CROSS-REFERENCE TO RELATED APPLICATION

This application is based upon and claims the benefit of priority of the prior Japanese Patent Application No. 2016-081125, filed on Apr. 14, 2016, the entire contents of which are incorporated herein by reference.

FIELD

A certain aspect of the embodiments discussed herein is related to wiring substrates and methods of manufacturing a wiring substrate.

BACKGROUND

A wiring substrate in which a low-density wiring layer including an insulating layer famed of a thermosetting resin is formed on a core substrate and a high-density wiring layer including an insulating layer formed of a photosensitive resin is formed on the low-density wiring layer is proposed. (See, for example, Japanese Laid-open Patent Publication No. 2014-225632.) In recent years, electronic components have been reduced in size to be mounted on wiring substrates at a higher density. As a result, there is an increasing demand for reduction in the size and thickness and an increase in the signal transmission speed of wiring substrates.

SUMMARY

According to an aspect of the embodiments, a wiring substrate includes an insulating layer, a stack including wiring layers and photosensitive-resin insulating layers on a first surface of the insulating layer, a wiring layer on a second surface of the insulating layer, having a lower wiring density than the wiring layers, a metal core plate buried in the insulating layer and positioned on the stack side with respect to the center of the insulating layer in its thickness direction, and a via wiring buried in the insulating layer to have a first end face exposed at the first surface and joined to the lowermost one of the wiring layers, and a second end face joined to the metal core plate. The first surface and the first end face are substantially flush with each other. The wiring layers include a signal line, and a ground line concentrically formed around the signal line, with a predetermined interval therebetween.

The object and advantages of the embodiments will be realized and attained by means of the elements and combinations particularly pointed out in the claims.

It is to be understood that both the foregoing general description and the following detailed description are exemplary and explanatory and not restrictive of the invention, as claimed.

DESCRIPTION OF EMBODIMENTS

Figure 1A:
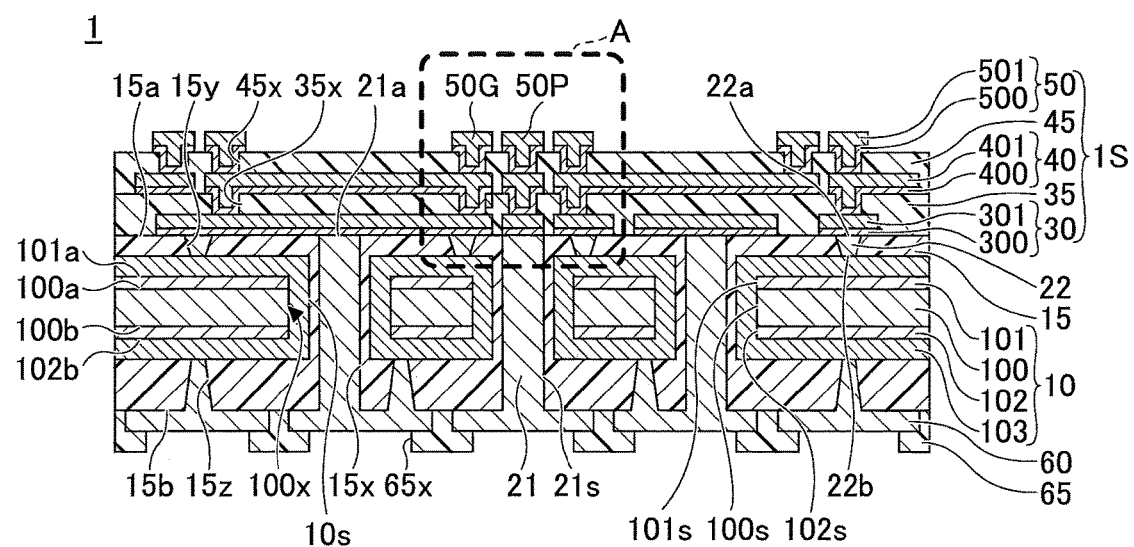
FIGS. 1A and 1B are diagrams depicting a wiring substrate according to a first embodiment.

As noted above, there is an increasing demand for reduction in the size and thickness and an increase in the signal transmission speed of wiring substrates. Reducing the thickness of the core substrate of a wiring substrate to meet the demand, however, reduces the mechanical strength of the core substrate, thus causing a problem in that the stiffness of the wiring substrate is reduced to cause the wiring substrate to be more likely to warp.

Furthermore, simply providing wiring patterns at a high density causes problems such as crosstalk and noise between wiring patterns, thus affecting transmission of high-speed signals.

According to an aspect of the present invention, a wiring substrate less likely to warp and capable of good transmission of high-speed signals is provided.

Preferred embodiments of the present invention will be explained with reference to accompanying drawings. In the drawings, the same element is referred to using the same reference numeral, and a repetitive description thereof may be omitted.

[a] First Embodiment

Figure 1B:
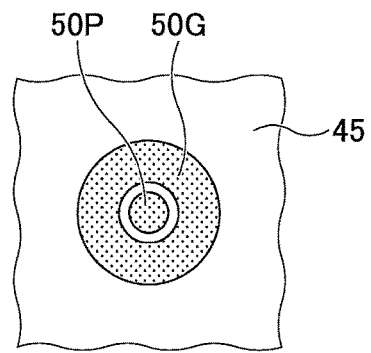

First, a structure of a wiring substrate according to a first embodiment is described. FIGS. 1A and 1B are diagrams depicting a wiring substrate according to the first embodiment. FIG. 1A is a cross-sectional view of the wiring substrate. FIG. 1B is a plan view of a region A of the wiring substrate of FIG. 1A enclosed by a dashed line in FIG. 1A. In FIG. 1B, a pad 50P and a wiring pattern 50G are indicated by a dot pattern for clarification.

Referring to FIG. 1A, a wiring substrate 1 includes a metal core plate 10, an insulating layer 15, through vias 21, a wiring layer 22, a wiring layer 30, an insulating layer 35, a wiring layer 40, an insulating layer 45, a wiring layer 50, a wiring layer 60, and a solder resist layer 65.

According to the wiring substrate 1, the wiring layer 30, the insulating layer 35, the wiring layer 40, the insulating layer 45, and the wiring layer 50 are successively stacked on a first surface 15a of the insulating layer 15 to form a stack (laminate) 1S. The wiring layer 60 and the solder resist layer 65 are formed on a second surface 15b of the insulating layer 15. The wiring layers 30, 40, and 50 of the stack 1S have a higher wiring density than the wiring layer 60. The insulating layer 15 is a typical example of an insulating layer, the wiring layer 30 is a typical example of a first wiring layer, and the wiring layer 60 is a typical example of a second wiring layer according to an embodiment of the present invention.

According to this embodiment, for convenience of description, the wiring layer 50 side of the wiring substrate 1 will be referred to as "upper side" or "first side," and the wiring layer 60 side of the wiring substrate 1 will be referred to as "lower side" or "second side." Furthermore, with respect to each part or element of the wiring substrate 1, a surface on the wiring layer 50 side will be referred to as "upper surface" or "first surface," and a surface on the wiring layer 60 side will be referred to as "lower surface" or "second surface." The wiring substrate 1, however, may be used in an inverted position or oriented at any angle. Furthermore, a plan view refers to a view of an object taken in a direction normal to the first surface 15a of the insulating layer 15, and a planar shape refers to the shape of an object viewed in a direction normal to the first surface 15a of the insulating layer 15. Furthermore, the dimension between the upper surface and the lower surface of each part or element of the wiring substrate 1 is referred to as "thickness."

The metal core plate 10 includes a metal plate 100, a metal layer 101, a metal layer 102, and a metal layer 103. The metal core plate 10 is buried in the insulating layer 15. The metal core plate 10 is buried in the insulating layer 15 at a position shifted toward the stack 1S relative to the center of the insulating layer 15 in the thickness direction of the insulating layer 15 (the metal core plate 10 buried in the insulating layer 15 is positioned on the side of the stack 1S with respect to the center of the insulating layer 15 in the thickness direction of the insulating layer 15). That is, the center of the metal core plate 10 in the thickness direction of the insulating layer 15 is closer to the stack 1S, or the first surface 15a, than to the second surface 15b (the center of the metal core plate 10 in the thickness direction of the insulating layer 15 is positioned closer to the side of the stack 1S, or the first surface 15a, than to the second surface 15b). As a result, the metal core plate 10 is positioned substantially at the center of the wiring substrate 1 in the thickness direction of the wiring substrate 1, thus making the wiring substrate 1 less likely to warp.

The metal plate 100 may be formed of sheet metal having a thickness of, for example, approximately 20 μm to approximately 200 μm. Multiple through holes 100x are formed, for example, in an area array, in the metal plate 100. The through holes 100x have, for example, a planar shape of a circle, and may have a diameter equal to or approximately equal to the thickness of the metal plate 100.

The metal plate 100 is preferably formed of a material having a low coefficient of thermal expansion and a high Young's modulus. Suitable materials for the metal plate 100 include, for example, tungsten (W), titanium (Ti), stainless steel (SUS), nickel (Ni), copper (Cu), and aluminum (Al). The coefficients of thermal expansion and Young's moduli of the above-described materials are as follows:

| Material | Coefficient of Thermal Expansion (ppm/° C.) | Young's Modulus (GPa) |
| --- | --- | --- |
| W | 4 | 345 |
| Ti | 8 | 116 |
| SUS | 10 | 200 |
| Ni | 13 | 200 |
| Cu | 17 | 130 |
| Al | 23 | 70 |

Among the above-described materials, a metal having a lower coefficient of thermal expansion and a higher Young's modulus than a metal forming the wiring layers of the wiring substrate 1, such as copper, is preferably selected as the material of the metal plate 100 in light of prevention of the warpage of the wiring substrate 1. In particular, tungsten or titanium, which has a low coefficient of thermal expansion and a high Young's modulus, is preferably used for the metal plate 100. Furthermore, the metal plate 100, which may be used as ground (GND), preferably has a high electrical conductivity. Any of the above-described materials has an electrical conductivity at or above a certain value, and therefore, may be used as ground.

The metal layer 101 is formed on an upper surface 100a of the metal plate 100. The metal layer 102 is formed on a lower surface 100b of the metal plate 100. For example, a laminated film of a titanium film and a copper film formed on the titanium film may be used as each of the metal layers 101 and 102. The total thickness of the metal layers 101 and 102 may be, for example, approximately 100 nm to approximately 200 nm. The metal layers 101 and 102 are provided to increase adhesion between the metal plate 100 and the metal layer 103.

The metal layer 103 is formed to continuously cover an upper surface 101a and side surfaces 101s of the metal layer 101, inner wall surfaces 100s of the through holes 100x (inner wall surfaces of the metal plate 100 each defining one of the through holes 100x), and side surfaces 102s and a lower surface 102b of the metal layer 102. Suitable materials for the metal layer 103 include, for example, copper. The thickness of the metal layer 103 may be, for example, approximately 10 μm to approximately 20 μm.

The insulating layer 15 is formed on the upper surface and the lower surface of the metal core plate 10, and on inner wall surfaces 10s of the metal core plate 10 each extending between its upper surface and lower surface through one of the through holes 100x. Suitable materials for the insulating layer 15 include, for example, thermosetting insulating non-photosensitive resins such as an epoxy resin. Each through via 21 fills in one of through holes 15x each piercing through the insulating layer 15 through one of the through holes 100x. Accordingly, a resin forming the insulating layer 15 is provided on and between, namely, fills in the gap between a side surface 21s of each through via 21 and one of the inner wall surfaces 10s of the metal core plate 10. As a result, the through vias 21 and the metal core plate 10 are electrically insulated. Suitable materials for the through vias 21 include, for example, copper. Hereinafter, the through vias 21 may be collectively referred to as "through via 21" where one of the through vias 21 is representatively described. Furthermore, the through holes 15x may be collectively referred to as "through hole 15x" where one of the through holes 15x is representatively described.

The wiring layer 22 is a vertical interconnect filling in each of via holes 15y formed in the insulating layer 15 covering the upper surface of the metal core plate 10. That is, the wiring layer 22 is a via buried in the insulating layer 15 with a first end face (first surface) 22a exposed at the first surface 15a of the insulating layer and a second end face (second surface) 22b joined to (contacting) the metal layer 103 of the metal core plate 10. Each via hole 15y has an upper opening that is open at the first surface 15a of the insulating layer 15 and a lower opening that is open on the upper surface of the metal core plate 10. The upper opening is greater in diameter than the lower opening. Thus, each via hole 15y has an inverted truncated cone shape. The upper and lower openings of the via holes 15y may be, for example, approximately 10 μm to approximately 30 μm in diameter.

Suitable materials for the wiring layer 22 include, for example, copper. The thickness of the wiring layer 22 may be, for example, approximately 30 μm. The first end face 22a of the wiring layer 22, a first end face (first surface) 21a of the through via 21, and the first surface 15a of the insulating layer 15 are polished surfaces, and, for example, substantially flush with one another. In other words, the first end face 22a of the wiring layer 22, the first end face 21a of the through via 21, and the first surface 15a of the insulating layer 15 form a substantially flat surface. The roughness Ra of the first surface 15a of the insulating layer 15 may be, for example, approximately 15 nm to approximately 40 nm. The roughness Ra of the second surface 15b of the insulating layer 15 may be, for example, approximately 300 nm to approximately 400 nm.

Thus, the first surface 15a of the insulating layer 15 is smoother than the second surface 15b of the insulating layer 15. As a result of increasing the smoothness of the first surface 15a of the insulating layer 15 by reducing its roughness, wiring layers formed on the first surface 15a, such as the wiring layer 30, can be fine-line wiring layers (layers including high-density wiring patterns).

The wiring layer 30 is a wiring pattern formed on the first surface 15a of the insulating layer 15. The wiring layer 30 may include a seed layer 300 and an electroplating layer 301 stacked on the seed layer 300. The wiring layer 30 is electrically connected to the wiring layer 60 through the through via 21. Furthermore, the wiring layer 30 is electrically connected to the metal core plate 10 through the wiring layer 22. The lower surface of the seed layer 300 is directly bonded to the first end face 21a of the through via 21 and the first end face 22a of the wiring layer 22.

According to the wiring layer 30, for example, a laminated film of a titanium film and a copper film formed on the titanium film may be used for the seed layer 300. The thickness of the seed layer 300 may be, for example, approximately 100 nm to approximately 200 nm. Suitable materials for the electroplating layer 301 include, for example, copper. The thickness of the electroplating layer 301 may be, for example, approximately 1 µm to approximately 3 µm. The line/space of the wiring layer 30 may be, for example, approximately 2 µm/2 µm.

The "line" in "line/space" represents the width of a wiring pattern, and the "space" in "line/space" represents the interval between adjacent wiring patterns (wiring interval). For example, when the line/space is described as 2 µm/2 µm, this line/space indicates that the width of a wiring pattern is 2 µm and the wiring interval is 2 µm.

The insulating layer 35 is formed on the first surface 15a of the insulating layer 15 to cover the wiring layer 30. Suitable materials for the insulating layer 35 include, for example, insulating photosensitive resins whose principal component is a phenolic resin or a polyimide resin. The thickness of the insulating layer 35 may be, for example, approximately 5 pin to approximately 10 µm. The insulating layer 35 may contain a filler such as silica ($SiO_2$).

The wiring layer 40 is formed on the insulating layer 35 on its first side to be electrically connected to the wiring layer 30. The wiring layer 40 includes vias each filling in one of via holes 35x that pierce through the insulating layer 35 to expose the upper surface of the wiring layer 30, and wiring patterns formed on the upper surface of the insulating layer 35. The wiring layer 40 may include a seed layer 400 and an electroplating layer 401 stacked on the seed layer 400. The seed layer 400 and the electroplating layer 401 may be equal in material and thickness to, for example, the seed layer 300 and the electroplating layer 301, respectively. The wiring layer 40 may have the same line/space as, for example, the wiring layer 30.

The insulating layer 45 is formed on the upper surface of the insulating layer 35 to cover the wiring layer 40. The insulating layer 45 may be equal in material and thickness to, for example, the insulating layer 35. The insulating layer 45 may contain a filter such as silica.

The wiring layer 50 is formed on the insulating layer 45 on its first side to be electrically connected to the wiring layer 40. The wiring layer 50 includes vias each filling in one of via holes 45x that pierce through the insulating layer 45 to expose the upper surface of the wiring layer 40, and pads and wiring patterns formed on the upper surface of the insulating layer 45. The wiring layer 50 may include a seed layer 500 and an electroplating layer 501 stacked on the seed layer 500. The seed layer 500 and the electroplating layer 501 may be equal in material and thickness to, for example, the seed layer 300 and the electroplating layer 301, respectively.

A surface treatment layer (not depicted) may be formed on the surface (upper and side surfaces or upper surface alone) of the wiring layer 50. Examples of surface treatment layers include a gold (Au) layer, a Ni/Au layer (a laminated metal layer of a Ni layer and a Au layer that are stacked in this order), and a Ni/Pd/Au layer (a laminated metal layer of a Ni layer, a palladium [Pd] layer, and a Au layer that are stacked in this order). An anti-oxidation treatment such as an organic solderability preservative (OSP) process may be performed on the surface (upper and side surfaces) of the wiring layer 50 to form a surface treatment layer.

Referring to FIG. 1B, in the region A of the wiring substrate 1, the wiring pattern 50G having a substantially annular planar shape is concentrically disposed around the pad 50P having a substantially circular planar shape with a predetermined interval between the pad 50P and the wiring pattern 50G in the wiring layer 50. The pad 50P serves as a signal line, and the wiring pattern 50G serves as a GND line. Furthermore, the wiring layers 30 and 40 as well have the same structure as described above in the region A. As a result, a coaxial structure including a signal line and a GND line formed around the signal line with a predetermined interval between the signal line and the GND line is achieved in the region A.

In other words, in the wiring layers 30, 40, and 50, a GND line is formed to concentrically surround a signal line in a plan view. In the wiring layers 30, 40, and 50, wiring patterns serving as the GND line are concentrically and successively provided in a monolithic structure. According to embodiments of the present invention, the term "coaxial structure" refers to a wiring structure where a GND line concentrically surrounds a signal line at the center in a plan view.

The coaxial structure does not have to be provided across the entire stack 1S, and the application of the coaxial structure may be limited in particular to a signal line susceptible to noise or a signal line likely to become a noise source. This makes it possible to control noise and also to increase the wiring density of a region where the coaxial structure is not provided.

The wiring layer 60 is formed on the insulating layer 15 on its second surface 15b side. The wiring layer 60 includes vias each filling in one of via holes 15z formed in the insulating layer 15 covering the lower surface of the metal core plate 10, and wiring patterns formed on the second surface 15b of the insulating layer 15. The wiring patterns of the wiring layer 60 are electrically connected to the wiring layer 30 through the through via 21. The vias of the wiring layer 60 are electrically connected to the metal core plate 10. Suitable materials for the wiring layer 60 include, for example, copper. The wiring patterns of the wiring layer 60 may be, for example, approximately 10 µm to approximately 20 µm thickness. The line/space of the wiring layer 60 may be, for example, approximately 20 µm/20 µm.

Each via hole 15z has a lower opening that is open at the second surface 15b of the insulating layer 15 and an upper opening that is open on the lower surface of the metal core plate 10. The lower opening is greater in diameter than the upper opening. Thus, each via hole 15y has a truncated cone shape. The upper and lower openings of the via holes 15z may be, for example, approximately 60 to approximately 70 µm diameter.

The solder resist layer 65 is formed on the second surface 15b of the insulating layer 15 to cover the wiring layer 60.

Suitable materials for the solder resist layer 65 include, for example, insulating photosensitive resins whose principal component is a phenolic resin or a polyimide resin. The solder resist layer 65 may contain a filler such as silica.

The solder resist layer 65 includes openings 65x, and part of the wiring layer 60 is exposed at the bottom of the openings 65x. The exposed part of the wiring layer 60 serves as, for example, pads to be electrically connected to a mounting board such as a motherboard. The above-described surface treatment layer may be formed on the lower surface of the wiring layer 60 exposed at the bottom of the openings 65x. The thickness of the solder resist layer 65 may be, for example, approximately 20 μm to approximately 40 μm.

Figure 2A:
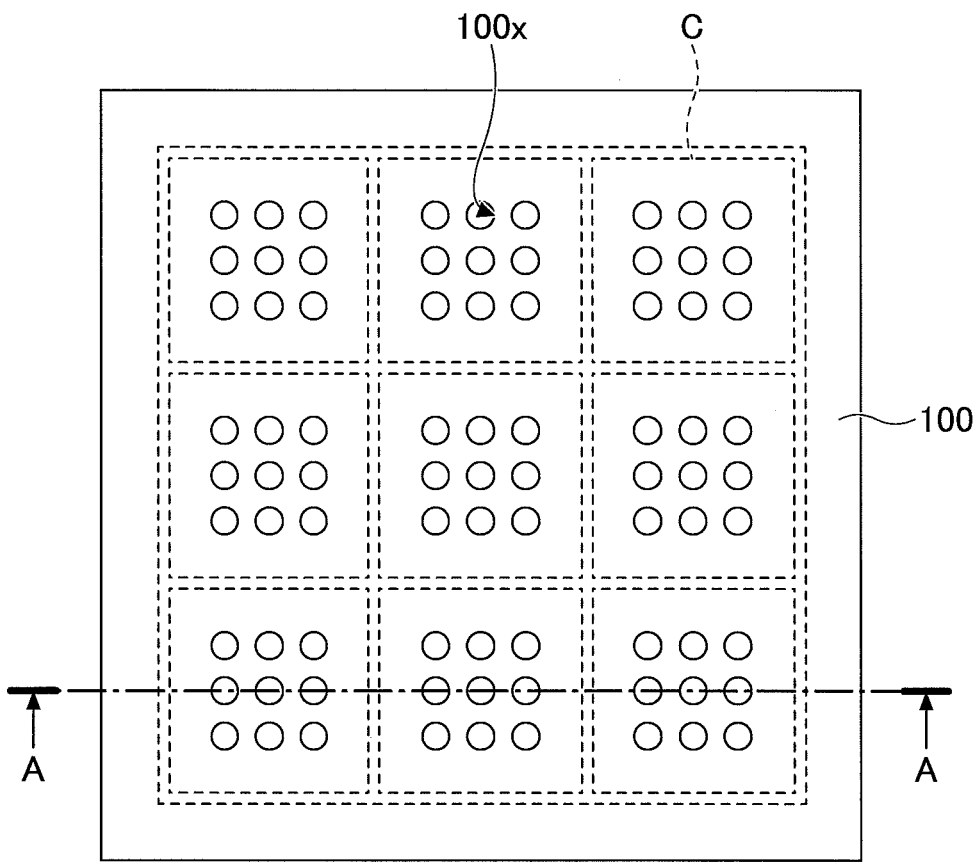
FIGS. 2A through 2T are diagrams depicting a process of manufacturing a wiring substrate according to the first embodiment.

Next, a method of manufacturing a wiring substrate according to the first embodiment is described. FIGS. 2A through 2T are diagrams depicting a process of manufacturing a wiring substrate according to the first embodiment. According to the process illustrated below, a structure to become multiple wiring substrates is manufactured and is thereafter divided into individual wiring substrates. According to this embodiment, however, the process may be adapted to manufacture a single wiring substrate.

Figure 2B:
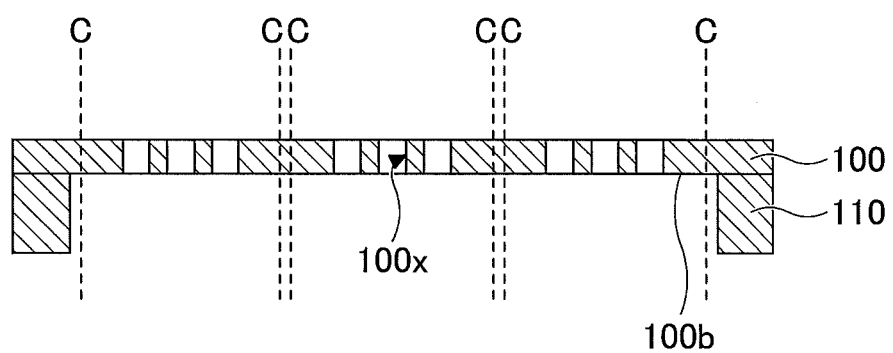

First, in the process depicted in FIGS. 2A and 2B, the metal plate 100 is prepared. FIG. 2A is a plan view of the metal plate 100. FIG. 2B is a cross-sectional view of the metal plate 100, taken along the line A-A of FIG. 2A. At this stage, the metal plate 100 includes multiple product regions C to be separated into individual wiring substrates 1. The product regions C are laid out in a matrix, being spaced from one another. The metal plate 100, which has nine product regions C by way of example in FIG. 2A, may have any number of product regions C. Furthermore, the product regions C do not have to be spaced from and may adjoin to one another.

Next, the through holes 100x are formed in each product region C of the metal plate 100. The through holes 100x may be formed by, for example, providing a mask on the metal plate 100 in such a manner as to expose a region where the through holes 100x are to be formed and removing the metal plate 100 in the exposed region by etching. Alternatively, the through holes 100x may be formed by laser processing or drilling. The material and thickness of the metal plate 100 and the planar shape and diameter of the through holes 100x are as described above.

Referring to FIG. 2B, a frame-shaped member 110 is provided in a peripheral portion of the lower surface 100b of the metal plate 100. The frame-shaped member 110 is provided outside the product regions C. Therefore, the frame-shaped member 110 is ultimately cut and does not become products (wiring substrates 1). The frame-shaped member 110 may be provided on an as-needed basis.

Figure 2C:
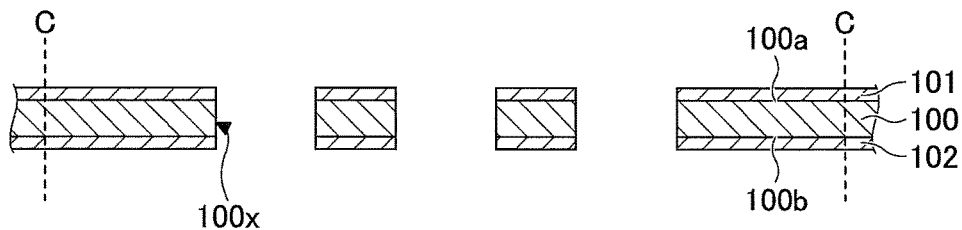

Next, in the process depicted in FIG. 2C, the metal layer 101 is formed on the upper surface 100a of the metal plate 100, and the metal layer 102 is formed on the lower surface 100b of the metal plate 100. The metal layers 101 and 102 may be formed by, for example, forming a titanium film on the upper surface 100a and the lower surface 100b of the metal plate 100 by sputtering or electroless plating and stacking a copper film on the titanium film. The total thickness of the metal layers 101 and 102 may be, for example, approximately 100 nm to approximately 200 nm.

Figure 2D:
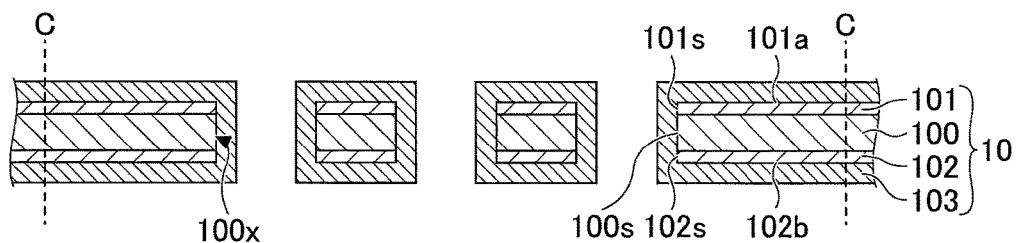

Next, in the process depicted in FIG. 2D, the metal layer 103 is formed to continuously cover the upper surface 101a and the side surfaces 101s of the metal layer 101, the inner wall surfaces 100s of the through holes 100x, and the side surfaces 102s and the lower surface 102b of the metal layer 102. The metal layer 103 may be formed by, for example, electroplating, using the metal plate 100, the metal layer 101, and the metal layer 102 as power feed layers. The material and thickness of the metal layer 103 are as described above.

Figure 2E:
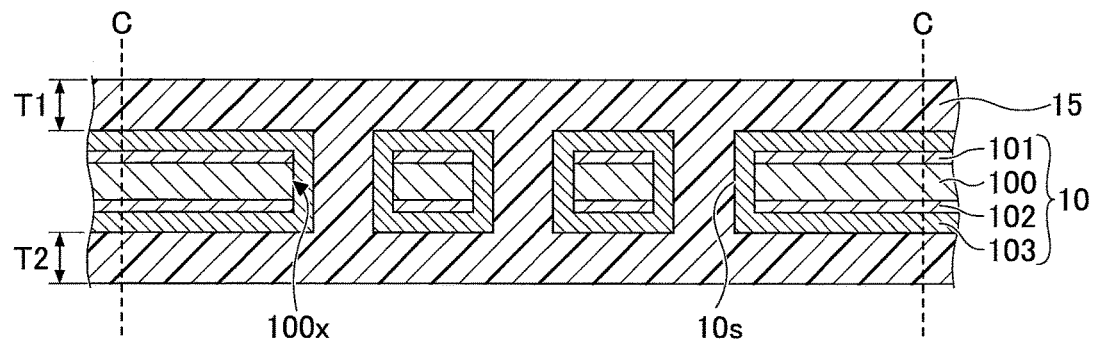

Next, in the process depicted in FIG. 2E, the insulating layer 15 is formed on the upper surface and the lower surface of the metal core plate 10, and on the inner wall surfaces 10s of the metal core plate 10 each extending between its upper surface and lower surface through one of the through holes 100x. For example, each of the upper surface and the lower surface of the metal core plate 10 is laminated with a thermosetting insulating non-photosensitive resin, such as an epoxy resin, in the form of a film (in a B-stage state). Then, the resin laminate is heated to a curing temperature or higher while being pressed, to be cured to form the insulating layer 15. By setting the aspect ratio (the ratio of opening size to depth) of the through holes 100x to approximately 1, it is possible to easily fill the through holes 100x with the resin. In this process, a thickness T1 of the insulating layer 15 on and above the upper surface of the metal core plate 10 and a thickness T2 of the insulating layer 15 under the lower surface of the metal core plate 10 may be substantially the same (for example, approximately 30 μm).

Figure 2F:
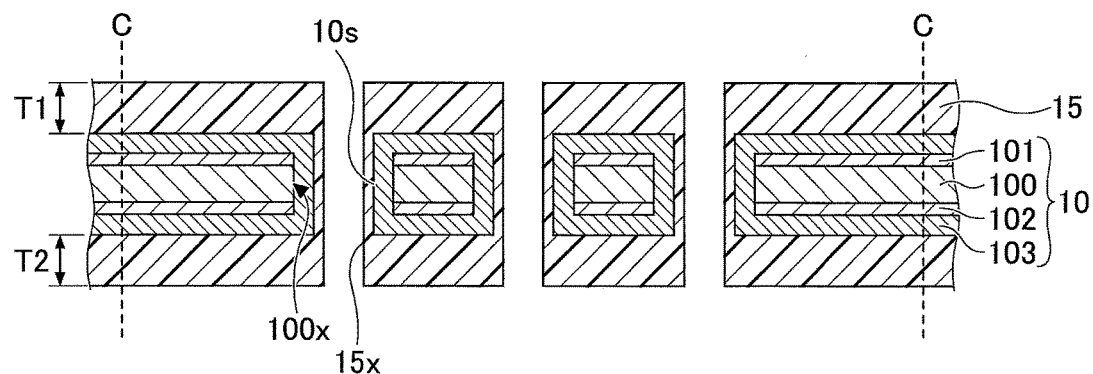

Next, in the process depicted in FIG. 2F, the through holes 15x piercing through the insulating layer 15 are famed through the through holes 100x. The through holes 15x are formed to leave the insulating layer 15 on the inner wall surfaces 10s of the metal core plate 10. The through holes 15x may be formed by, for example, laser processing or drilling.

Figure 2G:
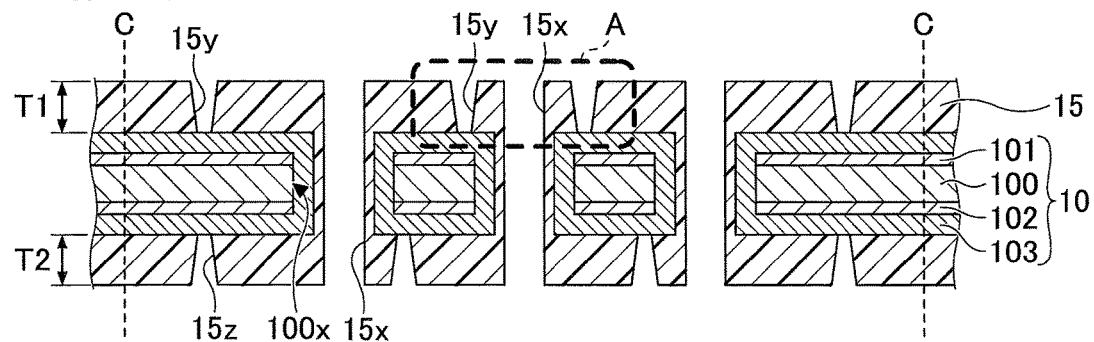

Next, in the process depicted in FIG. 2G, the via holes 15y piercing through the insulating layer 15 covering the upper surface of the metal layer 103 to expose the upper surface of the metal layer 103 and the via holes 15z piercing through the insulating layer 15 covering the lower surface of the metal layer 103 to expose the lower surface of the metal layer 103 are formed in the insulating layer 15. In the region A, the via hole 15y is concentrically formed to have a substantially annular planar shape around the through hole 15x having a substantially circular planar shape, with a predetermined interval between the through hole 15x and the via hole 15y. The via holes 15y and 15z may be formed by, for example, laser processing. The openings of the via holes 15y and 15z may be, for example, approximately 60 μm to approximately 70 μm in diameter. In the case of forming the via holes 15y and 15z by laser processing, it is preferable to perform a desmear process to remove residual resin adhering to the upper surface and the lower surface of the metal layer 103 exposed at the bottom of the via holes 15y and 15z.

Figure 2H:
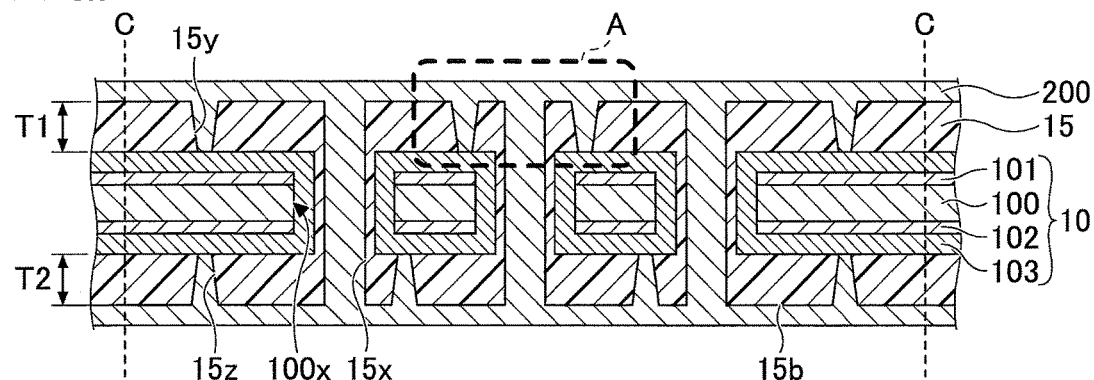

Next, in the process depicted in FIG. 2H, a metal layer 200 is formed to fill in the through holes 15x and the via holes 15y, cover the upper surface of the insulating layer 15, fill in the via holes 15z, and cover the second surface 15b of the insulating layer 15. For example, the metal layer 200 may be famed as follows. First, a seed layer (not depicted) is formed to continuously cover the inner wall surfaces of the through holes 15x (inner wall surfaces of the insulating layer 15 each defining one of the through holes 15x), the inner wall surfaces of the via holes 15y (inner wall surfaces of the insulating layer 15 each defining one of the via holes 15y), the upper surface of the metal layer 103 exposed at the bottom of the via holes 15y, the upper surface of the insulating layer 15, the inner wall surfaces of the via holes 15z (inner wall surfaces of the insulating layer 15 each defining one of the via holes 15z), the lower surface of the metal layer 103 exposed at the bottom of the via holes 15z, and the second surface 15b of the insulating layer 15. Then, for example, copper is deposited on the seed layer by electroplating, using the seed layer as a power feed layer.

Figure 2I:
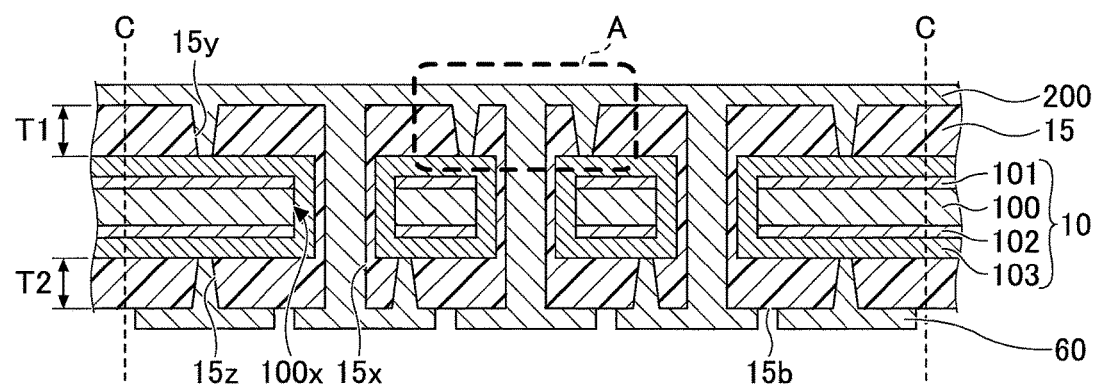

Next, in the process depicted in FIG. 2I, the metal layer 200 covering the second surface 15b of the insulating layer 15 is patterned to form the wiring layer 60. The wiring layer 60 includes vias filling in the via holes 15z and wiring patterns formed on the second surface 15b of the insulating layer 15. The wiring layer 60 may be formed by, for example, a subtractive process.

Figure 2J:
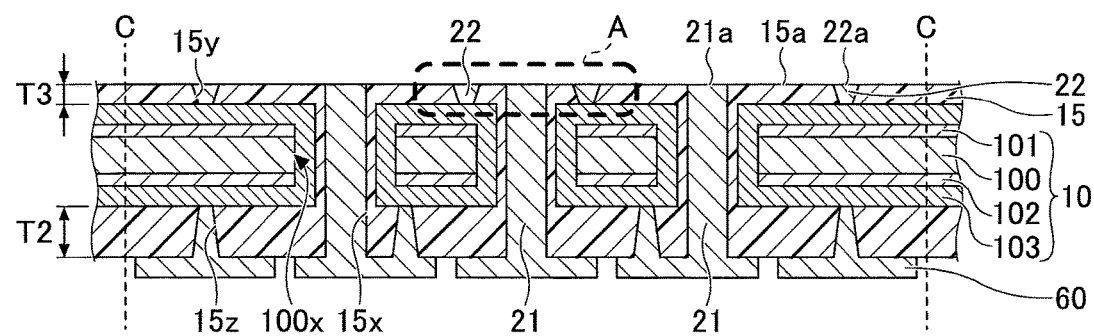

Next, in the process depicted in FIG. 2J, the metal layer 200 covering the upper surface of the insulating layer 15 and the upper surface of the insulating layer 15 are polished to expose the first surface 15a of the insulating layer 15, a first end face (first surface) of the metal layer 200 filling in the through holes 15x, and a first end face (first surface) of the metal layer 200 filling in the via holes 15y. As a result, the through vias 21 are formed in the through holes 15x, and the wiring layer 22, which is a vertical interconnect filling in the via holes 15y, is formed. The first surface 15a of the insulating layer 15, the first end face 21a of the through via 21, and the first end face 22a of the wiring layer 22 may be, for example, substantially flush with one another. In other words, the first surface 15a of the insulating layer 15, the first end face 21a of the through via 21, and the first end face 22a of the wiring layer 22 form a substantially flat surface. In the region A, the wiring layer 22 is concentrically formed to have a substantially annular planar shape around the through via 21 having a substantially circular planar shape, with a predetermined interval between the through via 21 and the wiring layer 22.

For example, chemical mechanical polishing (CMP) may be performed as polishing. The amount of polishing of the metal layer 200 and the insulating layer 15 may be, for example, approximately 10 μm to approximately 20 μm. A thickness T3 of the insulating layer 15 on and above the upper surface of the metal core plate 10 is smaller than the thickness T2 of the insulating layer 15 on and below the lower surface of the metal core plate 10. The thickness T3 may be, for example, approximately 10 μm to approximately 20 μm. The roughness Ra of the upper surface (first surface 15a) of the insulating layer 15, which is, for example, approximately 300 nm to approximately 400 nm before CMP (before polishing), can be reduced to approximately 15 nm to approximately 40 nm by CMP.

Figure 2K:
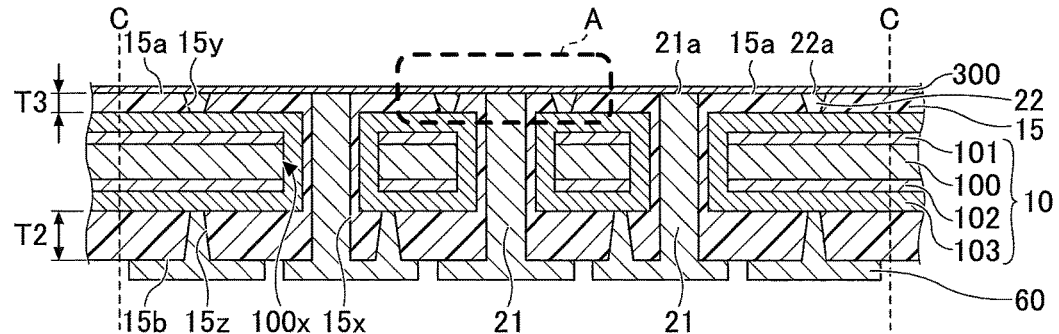
Figure 2L:
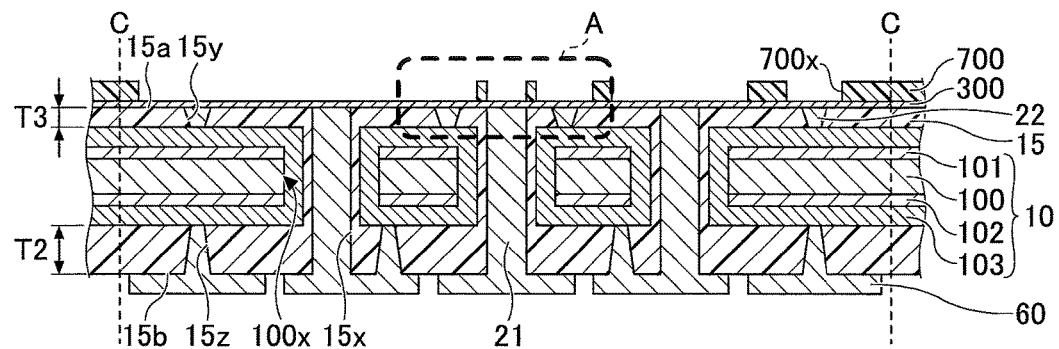
Figure 2M:
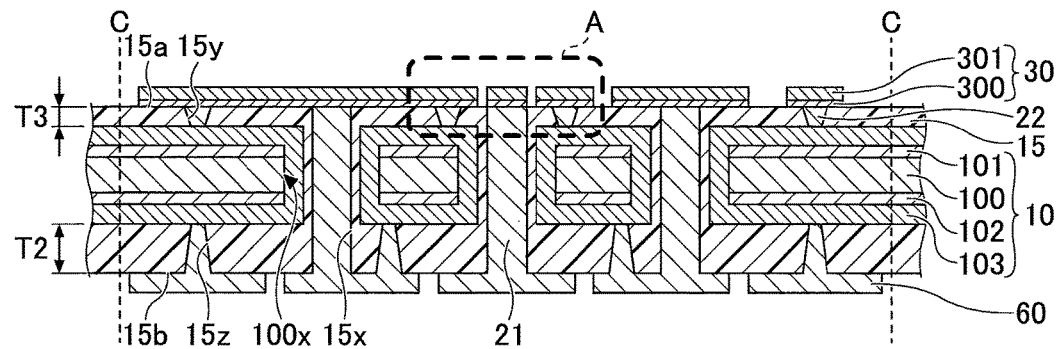

Next, in the process depicted in FIGS. 2K through 2M, the wiring layer 30 is formed. The wiring layer 30 may be formed using, for example, a semi-additive process. Specifically, first, as depicted in FIG. 2K, the seed layer 300 is famed by sputtering or electroless plating to continuously cover the first surface 15a of the insulating layer, the first end face 21a of the through via 21, and the first end face 22a of the wiring layer 22. For example, a laminated film of a titanium film and a copper film formed on the titanium film may be used for the seed layer 300. The thickness of the seed layer 300 may be, for example, approximately 100 nm to approximately 200 nm.

Next, as depicted in FIG. 2L, photosensitive resist is applied onto the seed layer 300, and is exposed to light and developed to form a resist layer 700 including openings 700x corresponding to the wiring layer 30.

Next, as depicted in FIG. 2M, the electroplating layer 301 formed of, for example, copper is famed in the openings 700x of the resist layer 700 by electroplating, using the seed layer 300 as a power feed layer. Then, after removal of the resist layer 700, part of the seed layer 300 not covered with the electroplating layer 301 is removed by etching, using the electroplating layer 301 as a mask. As a result, the wiring layer 30 having the electroplating layer 301 stacked on the seed layer 300 is faulted. The thickness of the electroplating layer 301 may be, for example, approximately 1 μm to approximately 3 μm. The line/space of the wiring layer 30 may be, for example, approximately 2 μm/2 μm.

Figure 2N:
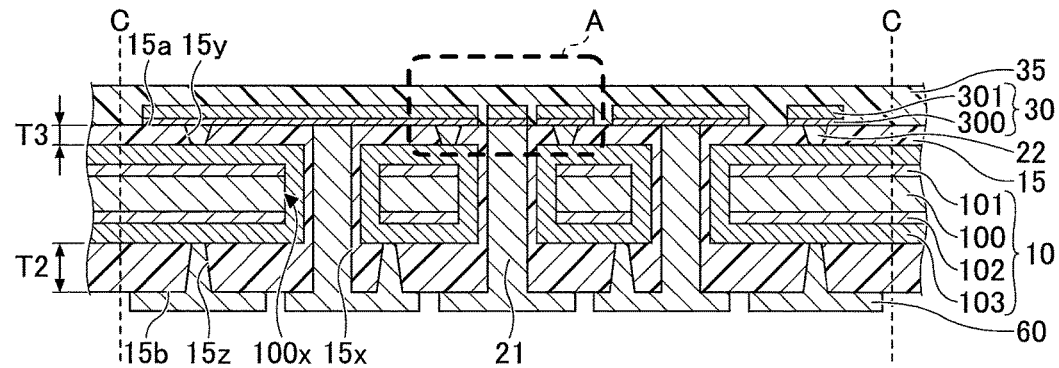

Next, as depicted in FIG. 2N, the insulating layer 35 is formed on the first surface 15a of the insulating layer 15 to cover the wiring layer 30. Suitable materials for the insulating layer 35 include, for example, insulating photosensitive resins whose principal component is a phenolic resin or a polyimide resin. The thickness of the insulating layer 35 may be, for example, approximately 5 μm to approximately 10 μm. The insulating layer 35 may contain a filler such as silica. In the case of using liquid or paste resin as the material of the insulating layer 35, the liquid or paste resin is applied onto the first surface 15a of the insulating layer 15 by, for example, spin coating to cover the wiring layer 30. In the case of using a resin film as the material of the insulating layer 35, the first surface 15a of the insulating layer 15 is laminated with the resin film so that the wiring layer 30 is covered with the resin film.

Figure 2O:
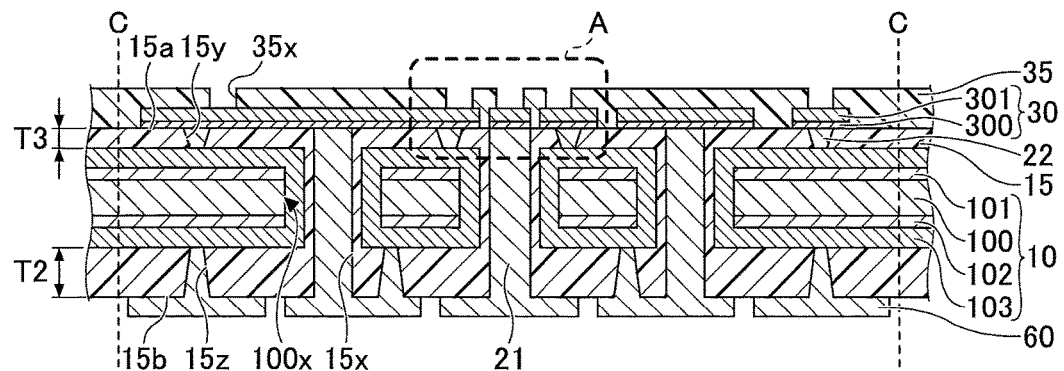
Figure 2P:
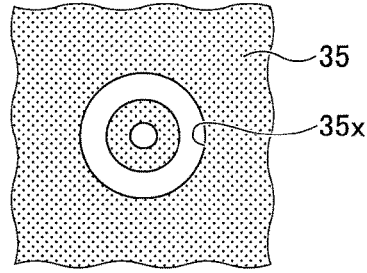

Next, in the process depicted in FIG. 2O, the insulating layer 35 is exposed to light and developed to form the via holes 35x that pierce through the insulating layer 35 to expose the upper surface of the wiring layer 30. In the region A, the via holes 35x are famed in a planar shape as depicted in FIG. 2P. That is, the via hole 35x having a substantially circular planar shape is formed at the substantial center of the region A, and the via hole 35x having a substantially annular planar shape is concentrically formed around the via hole 35x having a substantially circular planar shape, with a predetermined interval between the via holes 35x.

Figure 2Q:
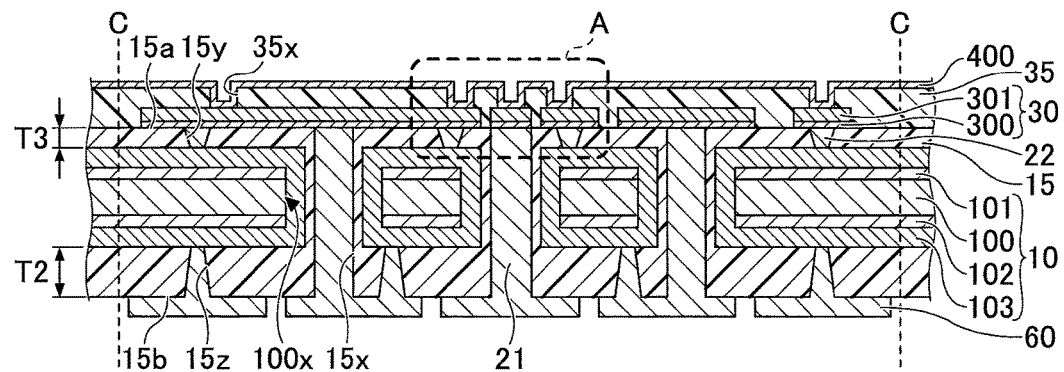

Next, in the process depicted in FIG. 2Q, the seed layer 400 is formed by sputtering or electroless plating to continuously cover the inner wall surfaces of the via holes 35x (inner wall surfaces of the insulating layer 35 each defining one of the via holes 35x), the upper surface of the wiring layer 30 exposed at the bottom of the via holes 35x, and the upper surface of the insulating layer 35. The seed layer 400 may be equal in material and thickness to, for example, the seed layer 300.

Figure 2R:
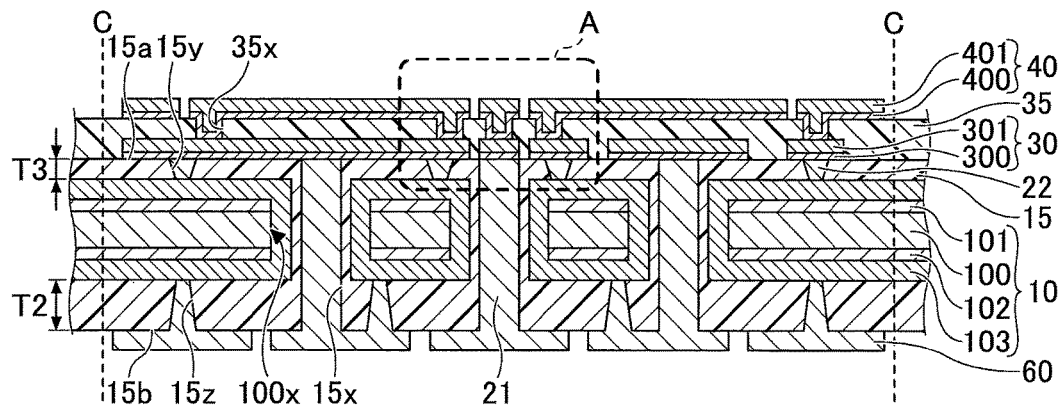

Next, in the process depicted in FIG. 2R, the wiring layer 40 having the electroplating layer 401 formed on the seed layer 400 is formed by, for example, a semi-additive process the same as in the process depicted in FIGS. 2L and 2M. The electroplating layer 401 may be equal in material and thickness to, for example, the electroplating layer 301. The wiring layer 40 may have the same line/space as, for example, the wiring layer 30.

Figure 2S:
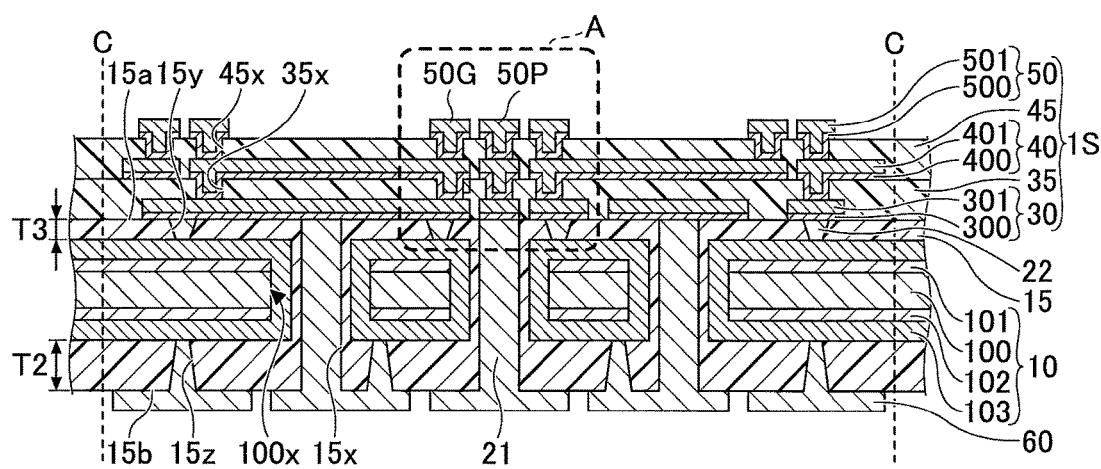
Figure 2T:
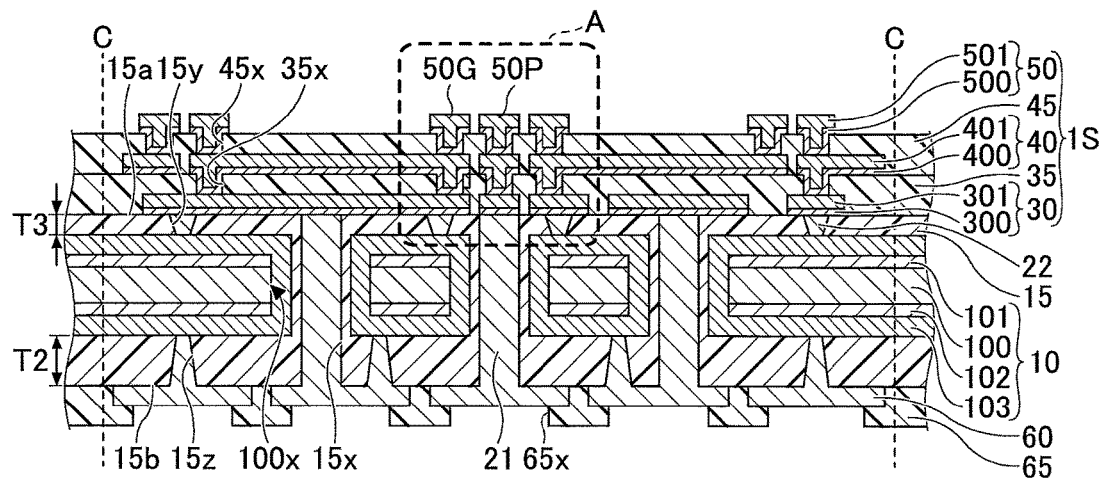

Next, in the process depicted in FIG. 2S, the process depicted in FIGS. 2N through 2R is repeated to form the insulating layer 45 and the wiring layer 50 on the wiring layer 40. As a result, the stack 1S is formed on the first surface 15a of the insulating layer 15. Furthermore, the coaxial structure as depicted in FIG. 1B is formed in the region A. Additional insulating layers and wiring layers may be stacked on an as-needed basis.

Next, in the process depicted in FIG. 2T, the solder resist layer 65 is formed on the second surface 15b of the insulating layer 15 to cover the wiring layer 60. The solder resist layer 65 may be formed of an insulating photosensitive resin in the same manner as the insulating layer 35. Next, the solder resist layer 65 is exposed to light and developed to form the openings 65x. Thereafter, the product regions C are cut into individual wiring substrates 1. As a result, the wiring substrate 1 depicted in FIGS. 1A and 1B is completed.

Thus, according to the wiring substrate 1 of the first embodiment, the metal core plate 10 including the metal plate 100 formed of a metal having a low coefficient of thermal expansion and a high Young's modulus is buried in the insulating layer 15. As a result, while the thickness of a core portion including the metal core plate 10 and the insulating layer 15 is reduced in the wiring substrate 1, it is possible to maintain the stiffness of the wiring substrate 1, and accordingly, to reduce the warpage of the entire wiring substrate 1.

Furthermore, the metal core plate 10 is disposed not at the center of the insulating layer 15 in the thickness direction of the insulating layer 15 but at the center of the entire wiring substrate 1 in the thickness direction of the wiring substrate 1. Therefore, the wiring substrate 1 is vertically substantially symmetrical with respect to the metal core plate 10, thus making it possible to further reduce the warpage of the entire wiring substrate 1.

Furthermore, for example, the wiring layer 50, which is a fine-line wiring layer, forms a coaxial structure. Therefore, it is possible to block noise from adjacent wiring patterns or external noise. In the case where the wiring layer 50 is a noise source, it is possible to block noise and reduce the influence of noise over surrounding wiring patterns or semiconductor chips. These enable good transmission of high-speed signals.

Furthermore, the metal core plate 10 is disposed at a position shifted toward the wiring layer 30, which is a fine-line wiring layer, relative to the center of the insulating layer 15 in the thickness direction of the insulating layer 15. In other words, the metal core plate 10 buried in the insulating layer 15 is positioned on the side of the stack 1S with respect to the center of the insulating layer 15 in the thickness direction of the insulating layer 15. Therefore, it is possible to reduce the distance between a center signal line and a peripheral GND line in the coaxial structure, thus improving electrical characteristics.

Furthermore, by positioning the metal core plate 10 used as GND close to, for example, the wiring layer 30, which is a fine-line wiring layer, it is possible to improve electrical characteristics (control impedance and reduce crosstalk) in the entire fine-line wiring layer.

[b] Second Embodiment

According to a second embodiment, a semiconductor chip is mounted on the wiring substrate 1 (by flip chip bonding) to form a semiconductor package. In the description of the second embodiment, a description of the same components as those of the above-described embodiment is omitted.

Figure 3:
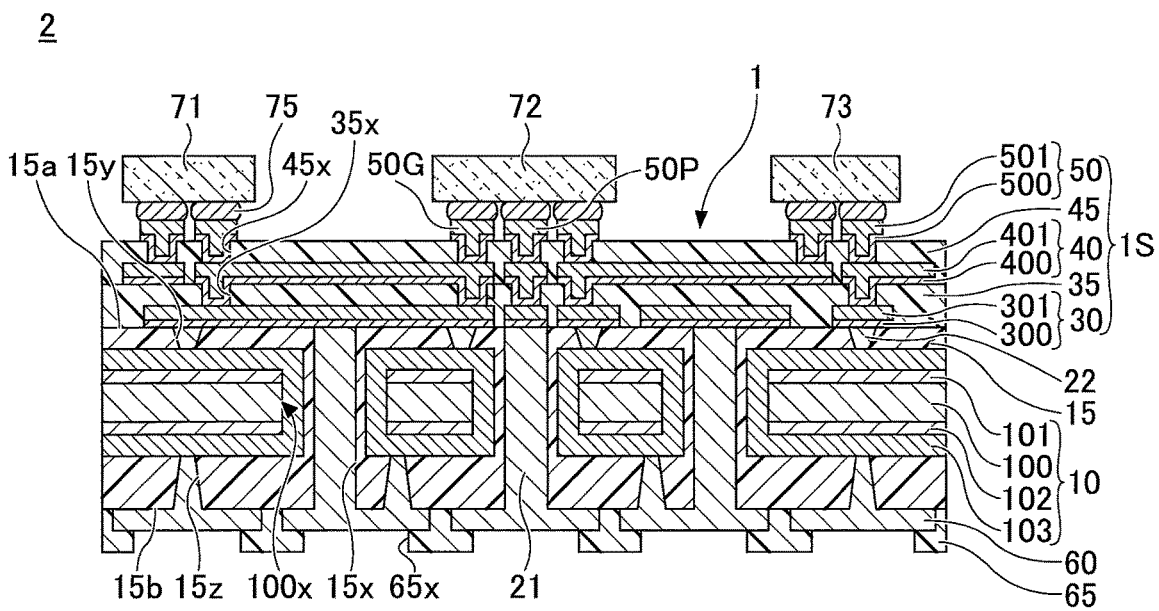
FIG. 3 is a cross-sectional view of a semiconductor package according to a second embodiment.

FIG. 3 is a cross-sectional view of a semiconductor package according to the second embodiment. Referring to FIG. 3, a semiconductor package 2 includes the wiring substrate 1 depicted in FIGS. 1A and 1B, semiconductor chips 71, 72, and 73, and bumps 75. According to the semiconductor package 2, a surface of the wiring substrate 1 on the insulating layer 45 side serves as a semiconductor chip mounting surface on which semiconductor chips are mounted, and a surface of the wiring substrate 1 on the solder resist layer 65 side serves as an external connection surface on which external connection terminals are to be formed.

Each of the semiconductor chips 71, 72, and 73 includes, for example, a thinned semiconductor substrate formed of silicon (not depicted) and a semiconductor integrated circuit (not depicted) formed on the semiconductor substrate. Electrode pads (not depicted) are formed on the semiconductor substrate to be electrically connected to the semiconductor integrated circuit. The semiconductor chips 71, 72, and 73 may have either the same function or different functions. In addition to semiconductor chips, passive devices (such as resistors, capacitors, and inductors) may be mounted on the wiring substrate 1.

The bumps 75 electrically connect the electrode pads (not depicted) of the semiconductor chips 71, 72, and 73 and the wiring layer 50. The bumps 75 are, for example, solder bumps. Suitable materials for solder bumps include, for example, alloys containing lead (Pb), tin-copper (Sn—Cu) alloys, tin-silver (Sn—Ag) alloys, and tin-silver-copper (Sn—Ag—Cu) alloys. Underfill resin may fill in the space between the insulating layer 45 and the semiconductor chips 71, 72, and 73.

The semiconductor package 2 can thus be achieved by mounting a semiconductor chip on the wiring substrate 1 according to the first embodiment.

All examples and conditional language provided herein are intended for pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority or inferiority of the invention. Although one or more embodiments of the present invention have been described in detail, it should be understood that the various changes, substitutions, and alterations could be made hereto without departing from the spirit and scope of the invention.

Various aspects of the subject-matter described herein may be set out non-exhaustively in the following numbered clause:

1. A method of manufacturing a wiring substrate, the method including:

forming an insulating layer to bury a metal core plate in the insulating layer;

forming a first via hole in the insulating layer to expose a first surface of the metal core plate, the first via hole being open at a first surface of the insulating layer;

forming a second via hole in the insulating layer to expose a second surface of the metal core plate opposite to the first surface thereof, the second via hole being open at a second surface of the insulating layer opposite to the first surface thereof;

forming a metal layer filling in the first via hole and covering the first surface of the insulating layer, and filling in the second via hole and covering the second surface of the insulating layer;

patterning the metal layer covering the second surface of the insulating layer to form a first wiring layer including a first via filling in the second via hole;

polishing the metal layer covering the first surface of the insulating layer, and part of the insulating layer, to expose a first end face of a second via filling in the first via hole at the first surface of the insulating layer, so that the first surface of the insulating layer and the first end face of the second via are polished and flush with each other;

forming a second wiring layer on the first surface of the insulating layer so that the second wiring layer is joined to the first end face of the second via; and stacking a plurality of insulating layers formed of a photosensitive resin and a wiring layer on the second wiring layer to form a stack including a plurality of wiring layers including the second wiring layer and the plurality of insulating layers on the first surface, wherein the metal core plate is buried in the insulating layer at a position shifted toward the stack relative to a center of the insulating layer in a thickness direction of the insulating layer, the plurality of wiring layers has a higher wiring density than the first wiring layer, and the plurality of wiring layers includes a signal line, and a ground line concentrically formed around the signal line, with a predetermined interval between the signal line and the ground line.

What is claimed is:

1. A wiring substrate, comprising:
   a first insulating layer;
   a stack including a plurality of wiring layers and a plurality of insulating layers on a first surface of the first insulating layer, the plurality of wiring layers including a first wiring layer formed on the first surface of the first insulating layer, the plurality of insulating layers being famed of a photosensitive resin;
   a second wiring layer on a second surface of the first insulating layer opposite to the first surface, the second wiring layer having a lower wiring density than the plurality of wiring layers;
   a metal core plate buried in the first insulating layer and positioned on a side of the stack with respect to a center of the first insulating layer in a thickness direction of the first insulating layer; and
   a via wiring buried in the first insulating layer, the via wiring having a first end face exposed at the first surface of the first insulating layer and joined to the first wiring layer, and a second end face joined to the metal core plate,
   wherein the first surface of the first insulating layer and the first end face of the via wiring are substantially flush with each other, and
   the plurality of wiring layers includes a signal line, and a ground line concentrically formed around the signal line, with a predetermined interval between the signal line and the ground line.

2. The wiring substrate as claimed in claim 1, wherein
   the metal core plate includes a metal plate and a metal layer covering the metal plate, and
   the second end face of the via wiring is joined to a part of the metal layer that covers a surface of the metal plate positioned on the side of the stack.

3. The wiring substrate as claimed in claim 2, wherein the metal plate is formed of a metal having a lower coefficient of thermal expansion and a higher Young's modulus than a metal forming the plurality of wiring layers and the second wiring layer.

4. The wiring substrate as claimed in claim 3, wherein the metal plate is formed of tungsten or titanium.

5. The wiring substrate as claimed in claim 1, further comprising:
   a through via piercing through the first insulating layer to connect the first wiring layer and the second wiring layer, the through via having a first end face exposed at the first surface of the first insulating layer, the first end face of the through via being a polished surface substantially flush with the first surface of the first insulating layer and the first end face of the via wiring.

6. The wiring substrate as claimed in claim 5, wherein the through via pierces through the metal core plate with a resin forming the first insulating layer provided on and between a side surface of the through via and an inner wall surface of the metal core plate facing toward the side surface of the through via.

7. The wiring substrate as claimed in claim 1, wherein the first surface of the first insulating layer is smoother than the second surface of the first insulating layer.

8. The wiring substrate as claimed in claim 1, wherein
   the first wiring layer includes a seed layer and an electroplating layer stacked on the seed layer, and
   the first end face of the via wiring is directly bonded to the seed layer.

9. The wiring substrate as claimed in claim 1, wherein the first surface of the first insulating layer and the first end face of the via wiring are polished surfaces.

* * * * *